United States Patent [19]

Morton et al.

[11] 4,440,800
[45] Apr. 3, 1984

[54] VAPOR COATING OF POWDERS

[75] Inventors: David H. Morton, Kyle Bay; Stephen G. Szirmai, Dover Heights; Edmund C. Potter, St. Ives, all of Australia

[73] Assignees: Unisearch Limited, Kensington; Commonwealth Scientific and Industrial Research, Campbell, both of Australia

[21] Appl. No.: 255,662

[22] Filed: Apr. 16, 1981

[30] Foreign Application Priority Data

Apr. 24, 1980 [AU] Australia .......................... PE3290/80

[51] Int. Cl.³ .............................................. B05D 1/04
[52] U.S. Cl. ........................................ 427/13; 427/26; 427/27; 427/213; 427/216; 427/217; 427/220; 427/248.1; 427/250; 427/251
[58] Field of Search ....................... 427/13, 25, 26, 27, 427/213, 216, 217, 220, 248.1, 250, 251; 75/251

[56] References Cited

U.S. PATENT DOCUMENTS

| | | | |
|---|---|---|---|
| 3,670,699 | 6/1972 | Sargent | 427/27 X |
| 3,978,269 | 8/1976 | Martin | 428/403 |
| 4,150,905 | 4/1979 | Kaplan et al. | 401/215 |
| 4,209,550 | 6/1980 | Hagenbach et al. | 427/212 X |
| 4,233,365 | 11/1980 | Karg | 428/404 |
| 4,233,387 | 11/1980 | Mammino et al. | 427/221 X |

Primary Examiner—Thurman K. Page
Attorney, Agent, or Firm—Irvin A. Lavine

[57] ABSTRACT

A liquid or powder material can be dispersed by the application of electrostatic fields. The phenomena, referred to as "electrodispersion" is the dispersion by an intense electric field of part of a static bed of liquid or powder into a stable cloud of rapidly moving particles, and the maintenance of a dynamic equilibrium between the static and dispersed phases. The density of the dispersed cloud of particles varies with a number of factors, including the field strength and the nature of the powder. The electrodeposition effect is employed to produce a uniform and durable coating of controlled thickness on the individual particles, by the generation of a vapor of the desired coating—typically a metal or semiconductor material—and allowing the vapor to permeate the dispersed particles. The electric field ensures that only the particles are coated, and the dispersed particles, having the same charge, repel each other, avoiding agglomeration. Potential applications include the manufacture of high performance catalysts wherein expensive metals like platinum are vapor-coated onto an inexpensive metal powder. Other possibilities include the production of graphite-coated metal particles for making self-lubricating metal components such as bearings and shafts, and the manufacture of slow dissolving coatings on pharmaceutical powders.

18 Claims, 1 Drawing Figure

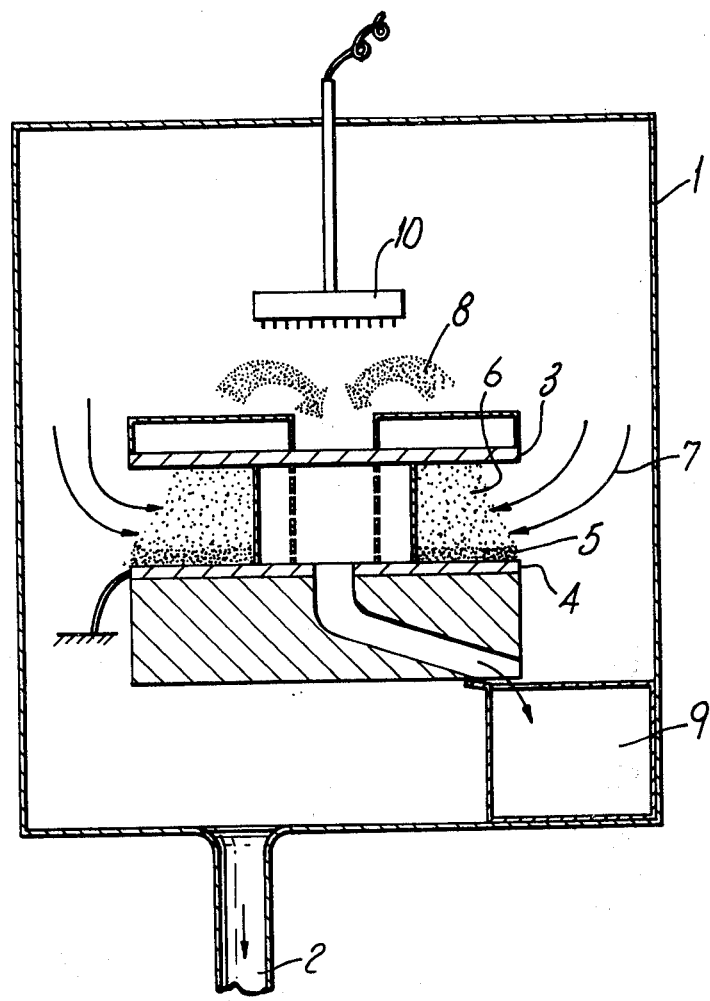

4,440,800

VAPOR COATING OF POWDERS

The present invention relates to the dispersion of materials, such as powders or liquids, by the application of an electrostatic field and to a method of vapour-coating of such dispersed materials. The invention also relates to coated materials and to uses therefore.

Prior to the present invention there has been no practical means available for coating of individual particles of either a liquid or a powdery substance without inter-particle contact resulting in agglomeration of the coated particles.

In the late 1960's, Russian researchers apparently suggested the use of d.c. fields for the dispersion of dust as a possible means for cleaning dusty metal surfaces (Zimon A.D—'Adhesion of dust and powder' Plenum Press, 1969, p.356). Following that report a team of Russian researchers made a more thorough investigation into selected aspects of the 'electorheological effect' involving mostly the mathematics of the rotation of the suspended particles and their charging by contact with an electrode (Shulman, Z.P., Matsepuro, A.D., Khusid, B.M.—'charge transfer by oscillating particles in electorheological suspensions' Vest. Akad. Nauk. BSSR, 1974, No. 4, 70–77.

More recently, Colver, G.M., in the United States of America, has carried out experimental studies of particle charging in connection with the dispersion of dust; see J. Appl. Phys., 1976, 47(11) 4839–3849 and J. of Electrostatics, 5 (1978) 205–222.

Our own developments in the art have been reported in J. Appl. Phys., 1980, 51 (10) 5215–5222 and 5223–5227.

It is an object of the present invention to provide a method of dispersion of a liquid or powdery substance by the application of an electric field.

It is another object of the present invention to provide a method of surface coating of a dispersed liquid or powdery substance which avoids agglomeration by inter-particle contact.

It is a further object of the present invention to provide a range of coated particles of liquid or powdery substances.

These and other objects of the present invention, will become apparent from the following description.

BRIEF DESCRIPTION OF THE DRAWING

The single FIGURE represents the apparatus suitable for carrying out the present invention.

In one of its aspects, the present invention provides a method of dispersion of a liquid or powdery substance which comprises placing the liquid or powdery substance into a container having a suitable arrangement of electrodes and applying a high electric field across the electrodes, with or without the added modulation of an imposed alternating current component of suitable frequency.

This dispersion of liquid or powdery substance by an intense electric field is referred to as "electrodispersion", and results in the dispersion of part of a static bed of liquid or powder into a stable cloud of rapidly moving particles, and the maintenance of a dynamic equilibrium between the static and dispersed phases.

In the case of a powdery substance, the electrodes are preferably so arranged that one electrode is imbedded inside the powder bed lying on the base of the container, and another electrode is arranged above the powder bed. The particles, having left the bed, continue to shuttle between the electrodes and transmit charges while doing so. With increasing field strengths, application of the electric field results in a fine dust cloud suspended over the static bed, while particles execute random oscillatory motions with motions seemingly less than the interelectrode distance. Some particles oscillate among their neighbours rather than move the whole distance between the electrodes, a behaviour that becomes more prevalent as the concentration increases, i.e. by raising the applied voltage. In view of the reduced mean free path of the particles, this is not too surprising. It suggests, nevertheless, that a special charge-transfer mechanism 'charge hopping', (from one particle to the next) may be at work.

The density of the dispersed cloud of particles, its appearance, the ease with which the dispersion can be achieved, and the proportions of powder in dispersed and static phases all vary with factors which include field strength, the nature of the powder, electrode geometry and properties of the dielectric fluid.

In air at atmospheric pressure there are usually no observable effects until field strength is increased to a threshold value, which depends on the powder used. At this point particles begin to rise from the bed and move in a direction of the field lines, and electric current begins to flow in the circuit. As the field strength is further increased the space above the powder surface eventually becomes filled with a dense cloud of particles moving rapidly with a large random component to their direction of movement. This condition is sustained as long as the field is applied and quickly subsides when it is discontinued. The lowest values of the minimum dispersing field, for particles of about 50 micrometer size, appear to be about 150 V $mm^{-1}$ in air. This of course will vary with particle size and density. At ordinary pressures the polarity of the electrodes can be reversed without noticeable effect on the dispersion process. Powders may also be dispersed in vacuum, but not normally in the pressure range 10-1–10-4 Torr.

Powder characteristics also affect the ease with which dispersions can be established. Alumina, silicon carbide, metal powders, and graphite all disperse easily in air. Powdered glass and fly ash (the aluminosilicate residue from the combustion of powdered coal) are more difficult and powders such as lycopodium, flowers of sulphur, and polystyrene spheres scarcely disperse at all.

Electrodispersion may also be observed in dielectric liquids, such as chlorinated hydrocarbons and paraffin oil, and in most respects these show a strong resemblance to gas dispersions. The differences include a considerably increased settling time and slower movement of the particles, as would be expected in the most viscous fluid.

In another aspect, the present invention provides a method of vapour coating of a liquid or powdery substance dispersed in an electric field which comprises dispersing the liquid or powdery substance by the application of a high electric field as described above, producing a vapour or the dispersion of a desired coating material and allowing said vapour or dispersion to permeate the dispersion of liquid or powdery particles, whereby the vapour condenses, or the dispersion attaches preferentially on the exposed charged surfaces of the particles, to give discrete coated particles without agglomeration.

The liquid or powder is dispersed forming a cloud of oscillating and rotating particles that are kept from agglomerating by virtue of the electric charges present, and this allows a thorough and even coating of the liquid or powder particles, and allows the manufacture of products which cannot easily be made in any other way. Because the dispersed particles all have the same polarity charge they repel one another without collision between particles.

The vapor-coating of the particles can be carried out at atmospheric pressure provided that a vapour of the coating material can be readily obtained at such pressure. In vacuum coating the coating rate may in some cases be limited by the need to maintain pressures below about 10-4 torr to prevent ionic cascade and corona discharge. Coating of powder dispersions in inert gas may result in more rapid coating of the dispersed particles.

The coating materials need not be so finely divided as to be reduced to individual ions. In some applications it is adequate to produce finely-divided particles or droplets of the coating materials at the electrode above the liquid or powder bed.

The coating material e.g. tungsten or carbon, can be vaporized or dispersed at the electrode above the liquid or powder bed, in which case the vapour ions, particles or droplets would have negative charge and the liquid or powder particles positive charge, resulting in a very effective coating of the liquid or powder material without loss of any of the coating material onto the surface of the container.

It is also possible, in many instances, to provide effective coatings even when the coating material is vaporized from an electrode which is at ground potential; in this case it is found that the electric field provided by the charged particles is sufficient to provide uniform coating of the powder.

Apparatus suitable for carrying out the vapour coating process is schematically illustrated in the drawing, in which a chamber 1, connectable to a vacuum pump source at 2, is provided with high-voltage electrodes 3 and 4 connectable to a high-voltage supply through spark gap electrode means 10. One of the electrodes 4, which is connected to earth, is imbedded in the powder bed 5. The other electrode 3, which may be either positive or negative, is arranged above the powder bed. Under the influence of the applied high voltage, the powder is dispersed as at 6 and is permeated by a generated vapour of the coating material 7. The coated particles 8 are then diverted to a storage or collection area 9, at the base of the chamber.

The flow of the coated particles through the apparatus can be controlled by a valve system (not shown), which provides the basis for a continuous vapour coating process with continuous removal of coated particles and recharging of the chamber with fresh or new liquid or powdered material to be the vapour-coated. The thickness of the coating of the vapour-coated material can be altered or controlled by varying the rate of withdrawal of the coated particles.

In a further aspect, the present invention provides discrete, free-flowing coated particles having either a liquid or solid inner core. By means of such coated particles it is possible to alter the surface properties of the material of the inner core including electrical properties, surface reactivity, friction (flow) characteristics, etc. For example it is possible to coat an inexpensive refractory metal powder (e.g. Tungsten) with a thin layer, 2 or 3 atoms in thickness, of a metal [illegible] platinum, nickel, palladium etc., to provide free-flowing particles with a very large surface area of metal, for use as an active catalyst in, for example, hydrogenation of coal. A further variation of this would be to prepare a thin coating of metal on an inert powder (such as glass) for use as a catalyst in gas-reactions in fluidised bed reactors.

Another application for the vapour-coated powders is in the use of intermetallic compounds for storing hydrogen. The storage of hydrogen by absorption into metal granules can be more efficient than storage of hydrogen gas under pressure (i.e. in gas cylinders).

Hydrogen has a very high affinity for certain metals, with the hydrogen diffusing in between the atoms of the metals and being so retained. The hydrogen can be removed by the application of heat (e.g. by application of an electric current to the metal). To recharge the metal with hydrogen the metal is cooled and the metal is allowed to reabsorb a new supply of hydrogen.

The problem is that intermetallic compounds have a very poor thermal conductivity, and the refueling cycle (i.e. reabsorption of hydrogen) may require an unacceptable period of time (e.g. 20 minutes or more) due to the time required to cool down the intermetallic compound.

According to the present invention it is possible to vapour coat intermetallic compounds (such as Iron Titanate, Magnesium alloys, etc.), in powdered or granular form, with palladium—which has a very high thermal conductivity. The coated particles are then compressed and shaped into a three-dimensional form (e.g. a bar or rod shape) wherein the Palladium provides the necessary pathway for more efficient cooling of the compressed mass, to enable recharging with hydrogen.

The palladium coating is also useful in that it has a high hydrogen permeability to the underlying intermetallic compound. The palladium also serves to filter out impurities from the hydrogen gas, which impurities are found in commercial hydrogen gas, which otherwise might tend to poison the intermetallic compound.

Other examples of use of the present invention include:

(i) Graphite-coated metal particles for the manufacture of self-lubricating metal particles, such as shafts and bearings, formed by powder-metallurgical processes;

(ii) Slow dissolving coatings on pharmaceutical powder products;

(iii) Use of uniform dispersions of powdery materials in high vacuum in Tandem-type Van der Graaf particle accelerators, where the dispersed cloud serves as a stripping-filter that has continuously adjustable thickness;

(iv) The surface coating of magnetic iron oxide particles with organic coatings to make them pH resistant;

(v) The micro-encapsulation of liquid particles in a solid coating by electrostatically suspending droplets of the material to be encapsulated in the vapour of the encapsuling or coating material; and (vi) The coating of an inexpensive metal powder with a thin layer of an inexpensive metal such as platinum, for use as a catalyst. The coated powder can then be sintered into blocks, providing a porous three-dimensional matrix with a very extensive surface area of platinum. Such a matrix could find potential application in future fuel cell technology, providing a matrix where oxygen and hydrogen can be reacted together to generate an electric current.

EXAMPLE

Powdered copper, with irregular particles of up to 50 micrometer size, were vapour-coated with zinc at a vaporization temperature of about 600°–800° C., an applied voltage of about 25,000–30,000 volts and under a vacuum of about 10-5 Torr. The coated particles were examined by atomic absorption spectroscopic means, and were found to have an average coating thickness of about 1–2 micrometers. Subsequently, a further batch was produced with heavier coatings of zinc, which were visible to the naked eye.

Although the invention has been described above with reference to preferred embodiments or examples, it will be appreciated that numerous variations, modifications or alternatives may be substituted for specifically described features, without departing from the spirit or scope of the invention as broadly described.

What we claim is:

1. A method of vapour coating of a particulate material, comprising dispersing said particulate material by the application of an electrostatic field and causing a vapour or dispersion of a coating material to permeate the dispersion of particulate material.

2. A method of vapour coating of a particulate material according to claim 1, wherein said vapour coating is conducted in a container with said vapour or dispersion of a coating material being supplied from a source external to said container.

3. A method of vapour coating of a particulate material according to claim 1, wherein dispersion of said particulate material and generation of said vapour or dispersion of a coating material are conducted in one container.

4. A method of vapour coating of a particulate material according to any one of claims 1 to 3, carried out under conditions of vacuum.

5. A method of vapour coating of a particulate material according to claim 1, wherein the coating is in a gas other than air.

6. A method according to claim 5, wherein said gas is an inert gas.

7. A method according to claim 5, wherein said gas is sulphur dioxide.

8. A method according to claim 1, wherein said coating material is vaporized or dispersed from an electrode above a bed of said particulate material.

9. A method according to claim 1, wherein said coating material is vaporized or dispersed from an electrode which is at ground potential.

10. A method according to claim 1, wherein the thickness of the coating of the vapour-coated material is controlled by varying the rate of withdrawal of said vapour-coating material.

11. A method of preparing discrete coated partilces having:
   (i) an inner core of a first material which is capable of being dispersed by the application of an electrostatic field, and
   (ii) an outer coating of a second material which is capable of being vaporized, said method comprising:
      (a) dispersing particles of said first material by the application of an electrostatic field; and
      (b) vaporizing or providing a dispersion of and subsequently depositing said second material as a vapor or dispersion onto the surface of said particles of the first material while said particles are dispersed.

12. The method of claim 11, wherein said second material is deposited to form a continuous outer coating on said particles.

13. The method of claim 11 or 12, wherein said second material is deposited from the vapour phase thereof.

14. The method of claim 13, wherein said second material is provided with an electric charge of opposite polarity to the said particles.

15. The method of claim 11, wherein one electrode is placed in a bed of said first material and a second electrode is arranged above said bed.

16. The method of claim 11, wherein said step of dispersing particles by the application of an electrostatic field comprises providing electrostatic field generating means, generating an electrostatic field therefrom, and placing said particles in said electrostatic field.

17. The method of claim 11, wherein said dispersion is a suspension of at least some of said particles.

18. The method of claim 1, wherein said dispersion is a suspension of at least some of said particles.

* * * * *